United States Patent [19]

Suyama et al.

[11] Patent Number: 4,737,959
[45] Date of Patent: Apr. 12, 1988

[54] SEMICONDUCTOR LASER ARRAY DEVICE

[75] Inventors: Takahiro Suyama, Tenri; Toshiro Hayakawa, Nara; Kohsei Takahashi, Tenri; Saburo Yamamoto, Nara, all of Japan

[73] Assignee: Sharp Kabushiki Kaisha, Osaka, Japan

[21] Appl. No.: 772,789

[22] Filed: Sep. 5, 1985

[30] Foreign Application Priority Data

Sep. 7, 1984 [JP] Japan ................ 59-188542

[51] Int. Cl.$^4$ ............................................. H01S 3/19
[52] U.S. Cl. .............................................. 372/44; 372/43
[58] Field of Search .................. 372/43, 44; 148/171, 148/172

[56] References Cited

U.S. PATENT DOCUMENTS

| | | | |
|---|---|---|---|
| 4,069,463 | 1/1978 | McGroddy et al. | 331/94.5 |
| 4,280,108 | 7/1981 | Scifres et al. | 331/94.5 |
| 4,371,968 | 2/1983 | Trussell, Jr. et al. | 372/50 |
| 4,385,389 | 5/1983 | Botez | 372/48 |
| 4,479,222 | 10/1984 | Hawrylo | 372/44 |
| 4,484,332 | 11/1984 | Hawrylb | 372/50 |

FOREIGN PATENT DOCUMENTS

| | | |
|---|---|---|
| 00455862 | 2/1982 | European Pat. Off. . |
| 0061220 | 9/1982 | European Pat. Off. . |
| 8500076 | 4/1984 | European Pat. Off. . |

OTHER PUBLICATIONS

D. Botez & J. C. Connolly, RCA Laboratories, Fourth International Conference on Integrated Optics and Optical Fiber Communication.
Journal of Luminescence, 1984, No. 29, L. J. Van Ruyven, Double Heterojunction Lasers and Quantum Well Lasers.

Primary Examiner—Gene Wan
Attorney, Agent, or Firm—Armstrong, Nikaido, Marmelstein & Kubovcik

[57] ABSTRACT

A semiconductor laser array device comprising a substrate having a plurality of adjacent striped channels on its surface, and a plurality of laser operation areas each of which contains a cladding layer, an active layer and another cladding layer which have been successively formed on the surface of said substrate by molecular beam epitaxy or metal organic chemical vapor deposition in such a manner that the surface of each of these layers becomes parallel to the surface of said substrate.

5 Claims, 3 Drawing Sheets

SEMICONDUCTOR LASER ARRAY DEVICE

BACKGROUND OF THE INVENTION

1. Field of the Invention

This invention relates to a semiconductor laser array device which has a built-in refraction index difference composed of the real number portion alone.

2. Description of the Prior Art

Semiconductor laser devices which are useful as light sources for information processing apparatus such as optical discs, laser beam printers etc., have been put into practical use. With an increase in information to be processed, quick information processing is required, and the development of semiconductor devices which can produce the highest possible output power but which can retain stabilized operation characteristics has begun. Even semiconductor lasers having a single active region, the development of which have been most advanced, can only produce an output power of approximately 50 mW at the maximum value in practical use.

On the other hand, phase-synchronized laser arrays (including gain guided laser arrays and index guided laser arrays) have been proposed in which a plurality of semiconductor laser devices are disposed in a parallel manner to attain optical phase coupling therebetween resulting in a laser device producing great output power with a single phase. However, in conventional gain guided laser arrays, loss of light increases with a decrease in a gain in the phase coupling region positioned between the adjacent laser operation areas, so that a phase shift of the electric field between the adjacent laser operation areas reaches 180°, resulting in the far-field patterns thereof having plural peaks, as shown in FIG. 4.

In order to improve the above-mentioned undesirable phenomena produced by conventional gain guided laser arrays, the use of index guided laser arrays can be recommended. The index guides laser arrays have been disclosed by the following articles:

A CSP-LOC (channeled-Substrate Plenar Large-Optical-Cavity) laser device proposed by D. Botez et al., of RCA Laboratories, Fourth International Conference on Integrated Optics and Optical Fiber Communication, Abstract 29B5-2, June 27–30, 1983 Tokyo, Japan has the disadvantage that the amount of laser light absorbed to the GaAs substrate varies depending upon the distance from the active layer to the mesa-portion of the substrate. If the distance between the active layer and the mesa-portion of the substrate were small, the amount of laser light absorbed to the GaAs substrate becomes great so that the laser device cannot produce high-output power. If the distance therebetween were great, the refractive index difference required for stable laser oscillation could not be created. Thus, a zero shift in the optical phase between the adjacent laser operation areas is unattainable.

A ridged laser array device proposed by D. E. Ackley et al., of Hewlett Packard Laboratories, Appln. Phys. Letters, 42(2), 15, p. 152, January 1983, has the disadvantage that laser light at the region between the adjacent laser operation areas is absorbed into the electrode to a great extent, resulting in a 180° phase shift between the adjacent laser operation areas.

As a laser array other than the above-mentioned index guided laser arrays, a buried type laser array device has been proposed by D. E. Ackley et al., of Hewlett-Packard Laboratories, Appln. Phys. Letters, 39(1), p. 27, July 1981, which operates in leaky modes to result in a far-field pattern having two peaks, although it is excellent in the phase coupling efficiency between the adjacent laser operation areas.

SUMMARY OF THE INVENTION

The semiconductor laser array device of this invention which overcomes the above-discussed and numerous other disadvantages and deficiencies of the prior art, comprises a substrate having a plurality of adjacent striped channels on its surface, and a plurality of laser operation areas each of which contains a cladding layer, an active layer and another cladding layer which have been successively formed on the surface of said substrate by molecular beam epitaxy or metal organic chemical vapor deposition in such a manner that the surface of each of these layers becomes parallel to the surface of the substrate.

The bottom face of each of said striped channels and the upper face of each of the mesa-portions between every two adjacent striped channels are, in a preferred embodiment, parallel to the surface of said substrate. The effective thickness of each of the flat portions of the active layer which corresponds to the surface of the substrate, the upper face of each of the mesa-portions positioned between every two adjacent striped channels and the bottom face of each of the striped channels, respectively, is, in a preferred embodiment, greater than that of each of the sloped portions of the active layer 3 which corresponds to the side portions of the striped channels.

The electroconductive region in the laser operation areas is, in a preferred embodiment, restricted to the striped region by an insulating layer formed on the surface of the region of the cap layer other than the striped regions.

The electroconductive region in the laser operation areas is, in a preferred embodiment, restricted to a Zn-diffused layer which is formed into a striped shape in the region of each of the laser operation areas.

Thus, the invention described herein makes possible the objects of providing a semiconductor laser array device which is of an index guide type and which can minimize the loss of laser light at the region between the adjacent laser operation areas, thereby attaining optical phase coupling between the adjacent laser operation areas with a zero phase shift therebetween.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
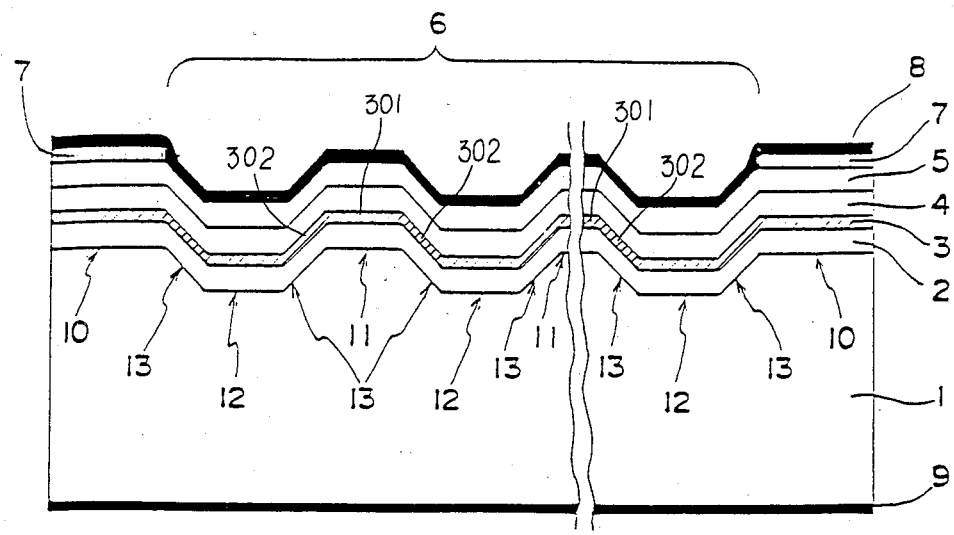
FIG. 1 is a sectional view of a semiconductor laser array device of this invention.

FIG. 1 shows a semiconductor laser array device of this invention, which is produced as follows:

On an n-GaAs substrate 1 on which a plurality of striped channels having a width of 6 μm and a pitch of 9 μm each are formed by photolithography, an n-$Ga_{1-x}Al_xAs$ cladding layer 2, a $Ga_{1-y}Al_yAs$ active layer 3, a p-$Ga_{1-x}Al_xAs$ cladding layer 4 and a p-GaAs cap layer 5 are successively formed by molecular beam epitaxy in such a manner that the surface of each of these layers becomes parallel to the surface of the substrate 1. Then, on the surface of the region of the cap layer 5 other than the striped regions 6, an insulating layer 7 is formed to restrict the electroconductive region thereby, followed by the formation of a p-side electrode 8 on the outer surface of the grown layers on the GaAs substrate 1 and an n-side electrode 9 on the back face of the GaAs substrate 1. The resulting wafer is cut into a unit having a width of 300 μm with the striped regions 6 as the central figure, and cleaved to form facets for resonance, resulting in the desired semiconductor laser array device of this invention.

Since the cladding layer 2, the active layer 3 and the cladding layer 4 are formed by molecular beam epitaxy as mentioned above, the effective thickness of each of the flat portions 301 of the active layer 3, which correspond to the surface 10 of the substrate 1, the upper face 11 of each of the mesa-portions positioned between every two adjacent striped channels and the bottom face 12 of each of the striped channels, respectively, is greater than that of each of the sloped portions 302 of the active layer 3 which correspond to the side portions 13 of the striped channels, resulting in an optical waveguide in each of the regions of the active layer corresponding to the upper face 11 of each of the mesa-portions and the bottom face 12 of each of the striped channels. When a direct current flow is applied between the electrodes 8 and 9, laser oscillation is attained in each of the optical waveguide regions. A laser light in one optical waveguide region achieves an optical phase coupling with another laser light in the adjacent optical waveguide region by the thin portions 302 of the active layer 3 corresponding to the side portions 13 of the striped channels, so that the laser lights produced from every emitting area can be observed to be a coherent laser light as a whole.

Figure 2:
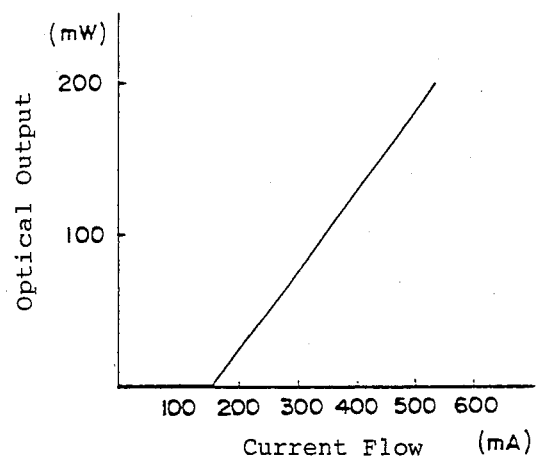
FIG. 2(a) is a graph showing the relationship between the optical output and the current characteristic of the semiconductor laser array device shown in FIG. 1.
FIG. 2(b) is an illustration showing the far-field pattern of the semiconductor laser array device shown in FIG. 1.
Figure 2:
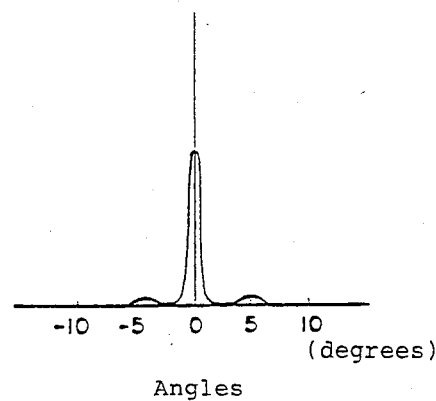
Figure 4:
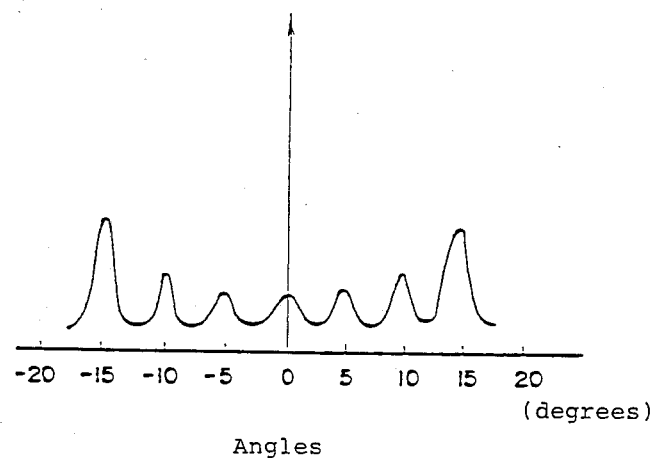
FIG. 4 is an illustration showing the far-field pattern of the conventional gain guided laser array device.

The relationship between the optical output, the current characteristic and the far-field pattern of the above-mentioned semiconductor laser array device having the three-striped channels are shown in FIGS. 2(a) and 2(b), respectively, indicating that the optical phase coupling between the adjacent laser operation areas has been attained with a zero phase shift therebetween.

Figure 3:
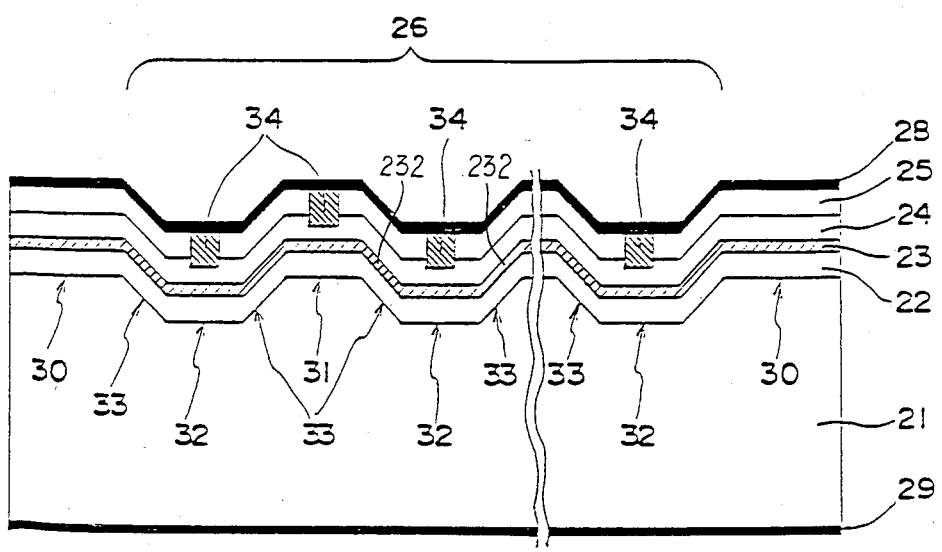
FIG. 3 is a sectional view of another semiconductor laser array device of this invention.

FIG. 3 shows another semiconductor laser array device of this invention, which is produced in the same manner as in the above-mentioned. On an n-GaAs substrate 21 having a plurality of striped channels formed thereon by photolithography, an n-$Ga_{1-x}Al_xAs$ cladding layer 22, a $Ga_{1-y}Al_yAs$ active layer 23, a p-$Ga_{1-x}Al_xAs$ cladding layer 24 and an n-GaAs cap layer 25 are successively formed by molecular beam epitaxy in such a manner that the surface of each of these layers becomes parallel to the surface of the substrate 21. A p-side electrode 28 and an n-side electrode 29 are disposed on the outer surface of the grown layers and the back face of the substrate 21, respectively. Moreover, a striped electroconductive region 34 composed of a Zn-diffused region of a p-type impurity is formed in the regions of each of the laser operation areas from the surface of the cap layer 25 toward the active layer 23. Due to the restricted electroconductive region 34 formed in each of the laser operation areas, leakage of current in each of the thin portions 232 of the active layer 23 can be effectively minimized.

Although the active layer having a single component of $Ga_{1-y}Al_yAs$ is only described in the above-mentioned examples, a multi-quantum well (MQW) structure which is composed of alternate layers consisting of around ten well layers having a thickness of tens of angstroms each and around ten barrier layers having a thickness ranging from tens to hundreds of angstroms each, can be used as the active layer. The successive formation of the cladding layer, the active layer and the cladding layer on the substrate can be achieved by metal organic chemical vapor deposition instead of molecular beam epitaxy.

It is understood that various other modification will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A semiconductor laser array device comprising:
    a substrate having a plurality of adjacent striped channels on a surface of said substrate, said surface forming a plurality of side portions, a plurality of bottom faces and a plurality of upper faces, said bottom faces being said striped channels, said upper faces located between two adjacent striped channels and said side portions being located between said upper face and said bottom face, two side portions and one upper face defining a mesa-portion, said side portions being sloped portions between said upper face and said bottom face;
    a plurality of laser operation areas formed parallel to the surface of said substrate, said plurality of laser operation areas containing a first cladding layer formed on said substrate, an active layer formed on said first cladding layer, a second cladding layer formed on said active layer, and a cap layer formed on said second cladding layer, said plurality of laser operation areas formed such that each layer is parallel to the surface of said substrate.

2. A semiconductor laser array device according to claim 1, wherein the bottom face of each of said striped channels and the upper face of each of the mesa-portions between every two adjacent striped channels are parallel to the surface of said substrate.

3. A semiconductor laser array device according to claim 2, wherein an effective thickness of said active layer which corresponds to the upper face of each of the mesa-portions positioned between every two adjacent striped channels and the bottom face of each of the striped channels, is greater than the effective thickness of each of the sloped portions of the active layer, which corresponds to the side portions of the striped channels.

4. A semiconductor laser array device according to claim 3, wherein an electroconductive region in said laser operation areas is restricted to the striped channel region by an insulating layer formed on the surface of the region of said cap layer other than the striped regions.

5. A semiconductor laser array device according to claim 4, wherein an electroconductive region in said laser operation areas is restricted to a Zn-diffused layer which is formed into a striped shape in the region of each of said laser operation areas.

* * * * *